United States Patent [19]

Totsuka et al.

[11] Patent Number: 5,061,891
[45] Date of Patent: Oct. 29, 1991

[54] CROSS COIL

[75] Inventors: Shigeki Totsuka; Yukio Ohike; Tadao Ito, all of Shizuoka, Japan

[73] Assignee: Yazaki Corporation, Japan

[21] Appl. No.: 377,059

[22] Filed: Jul. 10, 1989

[30] Foreign Application Priority Data

Nov. 21, 1988 [JP] Japan .............. 63-150769[U]
Jun. 30, 1989 [JP] Japan .............. 1-76361[U]

[51] Int. Cl.$^5$ .................. G01R 1/20; H01F 27/28
[52] U.S. Cl. ..................... 324/146; 336/188
[58] Field of Search ............ 324/146, 143, 131, 132; 335/299; 310/208; 336/188, 221

[56] References Cited

U.S. PATENT DOCUMENTS

| | | | |
|---|---|---|---|
| 1,133,750 | 3/1915 | Shaw | 336/188 X |
| 1,746,754 | 2/1930 | Adams | 336/188 X |
| 2,178,653 | 11/1939 | Slade | 336/188 X |
| 2,285,091 | 6/1942 | Holsten | 336/188 X |
| 2,872,653 | 2/1959 | Wiegand | 336/221 |
| 2,910,654 | 10/1959 | Wiegand | 336/188 X |
| 2,977,553 | 3/1961 | Blonder et al. | 336/188 X |
| 3,208,059 | 9/1965 | Ziegler | 324/146 X |
| 3,460,038 | 8/1969 | Ziegler | 324/132 |
| 4,633,174 | 12/1986 | Lindig et al. | 324/143 |
| 4,827,210 | 5/1989 | Lindig et al. | 324/146 |

FOREIGN PATENT DOCUMENTS

| | | |
|---|---|---|
| 133446 | 4/1984 | European Pat. Off. . |
| 192063 | 1/1986 | European Pat. Off. . |
| 57-132248 | 8/1982 | Japan . |
| 63-63773 | 4/1988 | Japan . |

Primary Examiner—Thomas J. Kozma
Attorney, Agent, or Firm—Wigman & Cohen

[57] ABSTRACT

Disclosed herein is a cross oil having a first coil winding for generating a first magnetic field when an electrical current flows therethrough and a second coil winding for generating a second magnetic field when an electrical current flows therethrough, and the second coil winding being wound so as to cross the first coil winding to each other. The cross coil comprises a mechanism for equalizing the magnitude of each of the first and second magnetic fields generated when identical electrical currents flows through each of the coil windings.

The equalizing mechanism comprises the arrangement of the turns of the windings in which the individual turns are alternately wound on top of the turns for the other winding.

1 Claim, 5 Drawing Sheets

CROSS COIL

BACKGROUND OF THE INVENTION

1. Field of the Invention

The present invention relates to a cross coil used in a cross coil-type indicator, in particular, relates to an improved cross coil used in a cross coil-type indicator in which a magnetic rotor, to which a shaft of an indicating pointer is secured, is rotated by a magnetic field component of the cross coil.

2. Description of the Prior Art

Conventionally, an indicator shown in FIG. 1 is commonly known as this type of cross coil type indicator. In this indicator, a disk-shaped magnetic rotor 2 to which a shaft of an indicating pointer 1 is secured, is positioned in a rotatable manner in a coil bobbin 3 which can be separated into an upper and a lower section. On the outer periphery of the coil bobbin 3 there is wound a first coil windings 4 into which is inserted a bearing 3a of the coil bobbin 3 through which the shaft of the indicating pointer is passed. Next a second coil windings 5, into which is also inserted the bearing 3a of the coil bobbin 3, is wound on the outer periphery of the first coil 4 windings at about 90° to the first coil windings 4. In addition, a scale 6 is installed on a bracket 3b of the coil bobbin 3 and an indicating pointer 7 is mounted to the shaft 1 on the top surface of the scale 6.

Specifically, as diagrammatically illustrated in FIG. 2, in the cross coil as described above the rotatable magnetic rotor 2 which comprises a permanent magnet is disposed in a magnetic field generated by the first and second coil windings 4, 5.

In this configuration, the magnetic field $\phi_1$, $\phi_2$ produced by the first and second coil windings 4, 5 are proportional to the product of the current flowing in the first and second coil windings 4, 5 and the number of turns in the windings. Therefore, if the number of turns for both the first and second coil windings 4, 5 is N and the currents flowing in the coil windings are $I_o \sin\theta$ and $I^o \cos\theta$ respectively, then the magnetic field component $\phi$ is in the direction of the vector component of the magnetic fields $\phi_1$, $\phi_2$ produced by the first and second coil windings 4, 5, and the magnetic field component is to describe a circle corresponding to a change of the angle $\theta$. Accordingly, by setting the angle $\theta$ to the specified measured amount each of the magnetic fields $\phi_1$, $\phi_2$ becomes $$\phi_1 = I_0 \sin\theta . N \quad (1)$$

$$\phi_2 = I_o \cos\theta . N \quad (2),$$

respectively.

The magnetic field component $\phi$ acts in the direction of the vector component of the magnetic fields $\phi_1$ and $\phi_2$, and its magnitude becomes $$\begin{aligned} \phi &= \sqrt{\phi_1^2 + \phi_2^2} \\ &= \sqrt{(I_o \sin\theta \cdot N)^2 + (I_o \cos\theta \cdot N)^2} \\ &= I_o \cdot N \end{aligned} \quad (3)$$

and by varying the angle $\theta$ to correspond to the specified measured amount as in FIG. 3, the direction of the magnetic field component $\phi$ corresponds to the specified measured amount. Accordingly the magnetic rotor 2 rotates in the direction of the component of the magnetic field, and as a result, by rotating in cooperation with an indicating pointer 7, the angle of rotation of the pointer 7 indicates the specified measured amount, which can be realized by a driver.

However, actually, in this type of conventional cross coil, as indicated in FIG. 4, first, the specified number of turns of the first coil 4 are wound, then, the specified number of turns of the second coil 5 are wound on the outside of the first coil 4 crossing those windings at 90°.

Therefore, in this type of conventional cross coil, as in FIG. 4, because the outer diameter of the first coil 4 which is wound on the inside differs from that of the second coil 5 which is wound on the outside with the same number of turns, the total length of the second coil 5 is the longer of the two. Accordingly, when the resistance per unit length of each coil is the same, the resistance of the second coil 5 is large in comparison with that of the first coil 4. Also, if the winding is performed so that the resistances of both coils are the same, the number of turns in the outside second coil 5 would be less in comparison with the number of turns in the first coil 4.

On the other hand, the magnitude of the magnetic fields $\phi_1$ and $\phi_2$ of the coils are proportional to the product of the current flowing in the coil and the number of turns of the winding, as described in equations (1) and (2). Accordingly, it is difficult for the conventional cross coil to equalize the maximum magnetic fields $I_o.N$ of the coils 4 and 5 which are produced to correspond to the specified measured amount (the angle $\theta$). Specifically, when identical voltages are applied to the coil 4, 5, the currents flowing in each of the coils 4, 5 are different from each other so that the magnetic fields $\phi_1$ and $\phi_2$ are not identical.

For example, when the number of winding turns N is the same for each coil, the resistance of the outside second coil 5 is large, as outlined above, so that the currents $I_o$ in equations (1) and (2) are not the same, and the current in the first coil 4 becomes large in comparison with the second coil 5. If the currents in each coil are $I_1$ and $I_2$ respectively, the magnetic fields $\phi_1$ and $\phi_2$ become:

$$\phi_1 = I_1 \sin\theta . N \quad (4)$$

$$\phi_2 = I_2 \cos\theta . N \quad (5)$$

and $I_1 > I_2$. Therefore, the magnitude of the magnetic field component $\phi$ becomes $$\begin{aligned} \phi &= \sqrt{\phi_1^2 + \phi_2^2} \\ &= \sqrt{(I_1 \sin\theta \cdot N)^2 + (I_2 \cos\theta \cdot N)^2} \\ &= N\sqrt{(I_1 \sin\theta \cdot)^2 + (I_2 \cos\theta \cdot)^2} \end{aligned} \quad (6)$$

and has only elliptic characteristics corresponding to the angle $\theta$ as shown in FIG. 5.

In this type of cross coil, for example, in the case of the current flowing for the angle $\theta$ of 45° corresponding to the specified measured value, the magnetic fields $\phi_1$ and $\phi_2$ for the coils 4, 5, become, from equations (4) and (5):

$$\phi_1 = I_1 \cdot N/\sqrt{2} \quad (7)$$

-continued $$\phi_2 = I_2 \cdot N/\sqrt{2} \tag{8}$$

The angle for this magnetic field component becomes $$\alpha = \tan^{-1}(\phi_1/\phi_2) \tag{9}$$
$$= \tan^{-1}(I_1/I_2) \neq 45°$$

and does not agree with the angle (45°) which corresponds to the specified measured value which should be indicated. Accordingly, in a conventional cross coil, because the direction of the magnetic field component of the cross oil does not agree with the direction of the angle $\theta$ which corresponds to the specified measured value, the problem arises that the specified measured value cannot be accurately displayed.

SUMMARY OF THE INVENTION

In view of the above problems of such conventional devices as described above, an object of the present invention is to provide a cross coil in which the magnitude of the magnetic field produced in each coil becomes identical when identical voltages are applied to the cross coils.

Another object of the present invention is to provide a cross coil in which the winding process for the cross coil winding is simple, and accurate indication characteristics are obtained when it is included in an indicator.

Still another object of the present invention is to provide a cross coil in which the winding process for the cross coil winding is unnecessitated, the cross coil is easily assembled when included in an indicator, and the cross coil can be miniaturized.

In order to achieve these objects, a cross coil according to the present invention comprises a pair of coils which are positioned so that they cross one another, with the individual turns alternately wound on top of the turns for the other coil, and the number of turns for each coil is the same.

In the cross coil of the present invention with the above structure, since the individual turns are alternately wound on top of the turns for the other coil, and the number of turns for each coil is the same, the total lengths of each coil become identical, and, accordingly, the resistances for each coil become also identical. Therefore, if the same voltage is applied to each coil, the currents flowing in each coil become identical, and the magnitudes of the magnetic fields become also identical.

As a result of this, when the same voltage is applied to each of the coils in the cross coil, the same magnitude of magnetic field is produced in each coil, and, for example, when the cross coil is applied in an indicator, the angle of indication of a pointer accurately corresponds to the specified measured value and erroneous indications can be prevented.

In addition, each of the first and second coils wound on a coil bobbin surrounding a magnetic rotor can be divided into two parts and wound on each side of a shaft of an indicating pointer. The configuration can be such that the second coil is wound on the outside of the windings of half of the first coil, and the remaining half of the first coil is wound on the outside of the second coil.

If this is done, since the second coil is wound on the outside of the windings of half of the first coil, and the remaining half of the first coil is wound on the outside of the second coil, the direction of winding only changes twice in the winding process, thus leading to the simplification of the manufacturing process of the cross coil.

Since the construction is such that half of the first coil, the second coil, and the remaining half of the first coil are wound on the circumference of the coil bobbin from the inside, in sequence, the undesirable effects on the component of the magnetic field caused from different distances from the magnetic rotor are cancelled out, thereby accurate indication characteristics being obtained.

The windings of the coil which are wound onto the magnetic rotor can be formed from a plurality of coil bodies which have both a narrow section and a wide section, and form windings of a cross coil with assembling these coil bodies by incorporating the wide sections of the coil bodies to the narrow section of the coil bodies which is adjoined.

By doing this, since the narrow section of the coil body is fitted to the wide section of the adjacent coil body, a cross coil can be easily formed from a plurality of coil bodies.

In this cross coil, since the narrow section of each coil body is positioned symmetrically to the magnetic rotor, the spacing from the magnetic rotor to each coil body is uniform and the magnitude and shape of each coil body is the same. Further, the balance of the resistances and the magnetic fields of the coils is also good. Accordingly, errors in measurement become small.

In addition, the coil bobbin in a conventional coil becomes unnecessary, allowing the size to be reduced by that amount.

These and other objects, features, and advantages of the present invention will become more apparent from the following description of the preferred embodiments taken in conjunction with the accompanying drawings, in which:

DETAILED DESCRIPTION OF THE PREFERRED EMBODIMENTS

Figure 1:
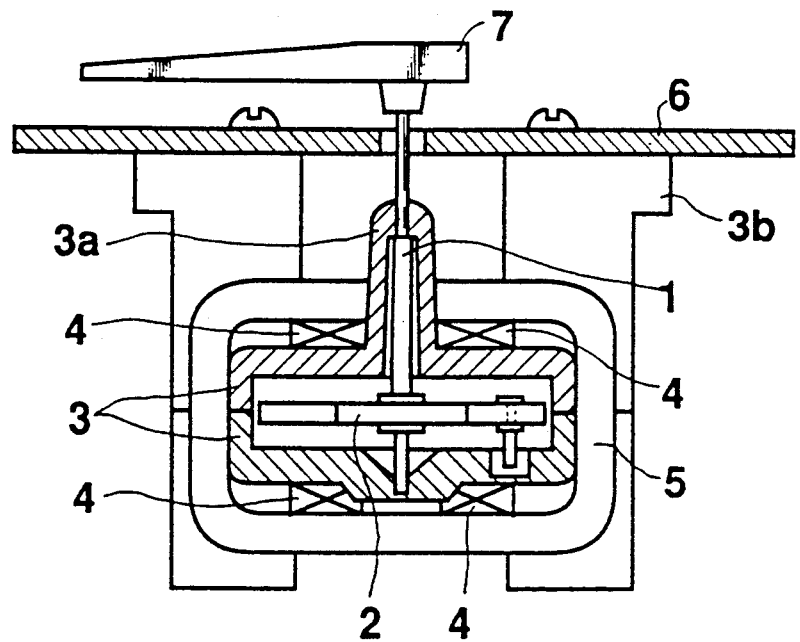
FIG. 1 is a sectional view showing an example of a conventional cross coil indicator.
Figure 2:
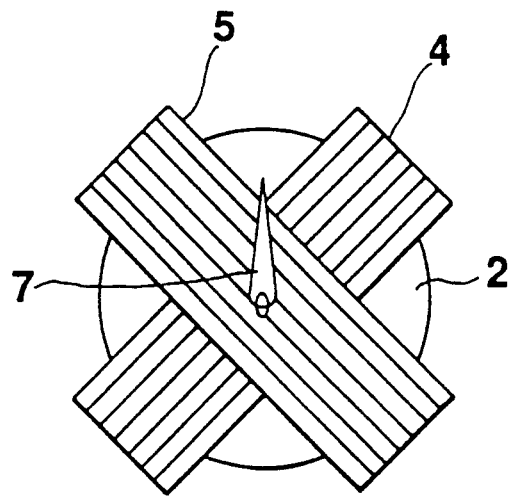
FIG. 2 is a plan view Of a conventional cross coil.

Now referring to the drawings, preferred embodiments will be described in conjunction with the drawings.

Figure 6:
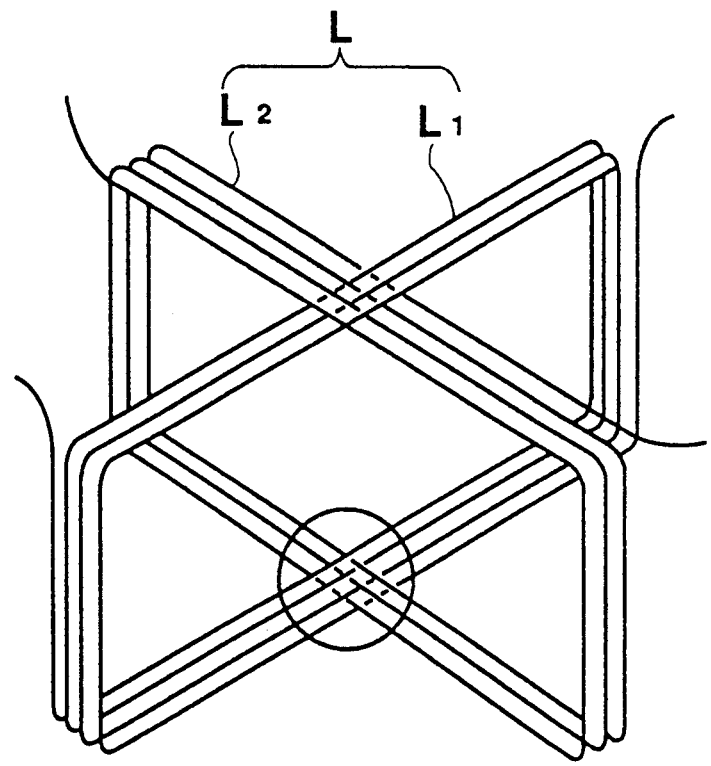
FIG. 6 is an explanatory drawing showing the winding conditions of a cross coil of a first embodiment of the present invention.
Figure 7:
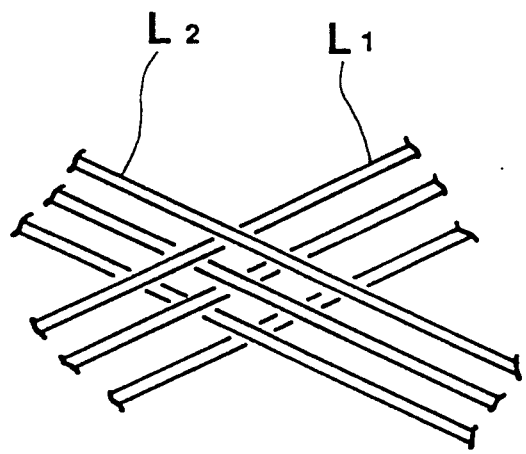
FIG. 7 is an enlarged drawing of the main part of FIG. 6.

FIG. 6 shows the first embodiment of the present invention. In the drawing, first and second coil windings $L_1$ and $L_2$ comprise a plurality of turns of a wire, respectively. The individual turns of the winding of a first coil $L_1$ and a second coil $L_2$ of a cross coil L are wound one at a time, alternating from one coil to the other. Specifically, one turn of the first coil $L_1$ is wound, followed by one turn of the second coil $L_2$, which is wound on top of the first turn. This is then followed by one turn of the first coil $L_1$, which is wound on top of the second turn. This winding operation is repeated the same number of times for each coil so that each coil has the same number of windings. At the point where the two coils $L_1$ and $L_2$ cross in this manner, the individual windings lie, alternately, one on top of the other, as shown in FIG. 7. Each of the two coils includes at least three turns, as shown in FIGS. 6 and 7. Accordingly, the total length of the first coil $L_1$ is substantially the same as the total length of the second coil $L_2$. Because the respective resistances are also identical, when the same voltage is applied to each coil, the magnitudes of the magnetic fields $\phi_1$ and $\phi_2$ of the coils $L_1$ and $L_2$ become also the same.

Figure 3:
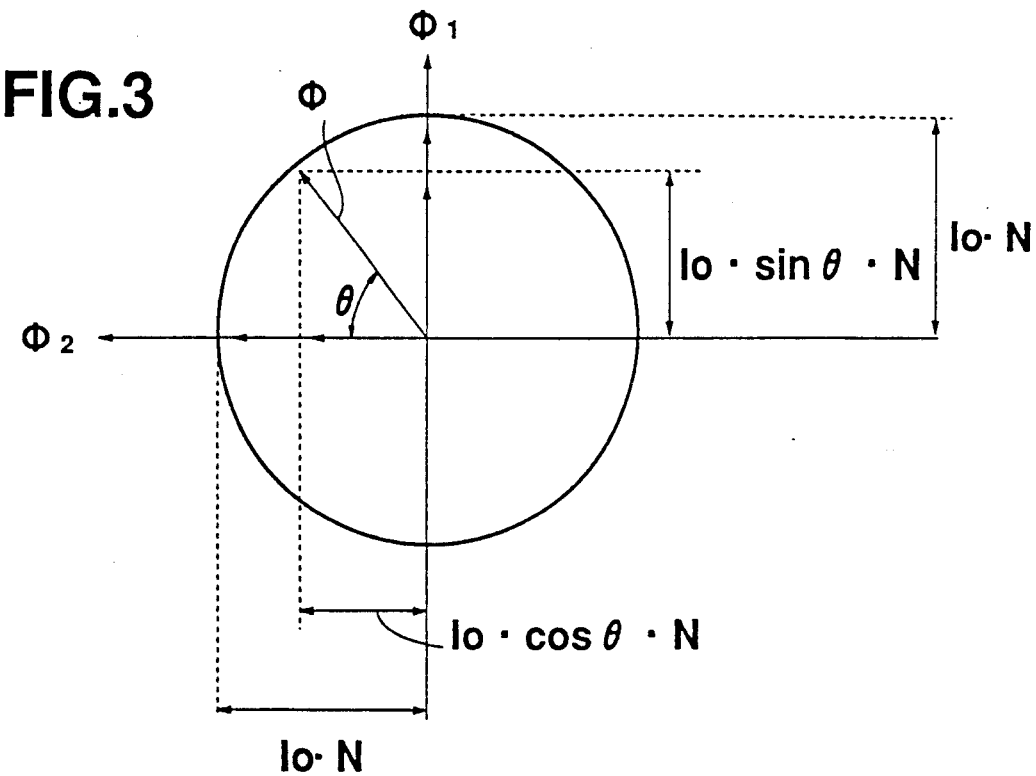
FIG. 3 is a phase diagram showing the characteristics of a magnetic field component to be produced in a cross coil.
Figure 4:
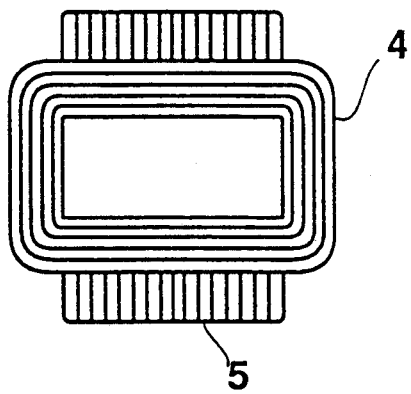
FIG. 4 is a sectional view showing a conventional cross coil.
Figure 5:
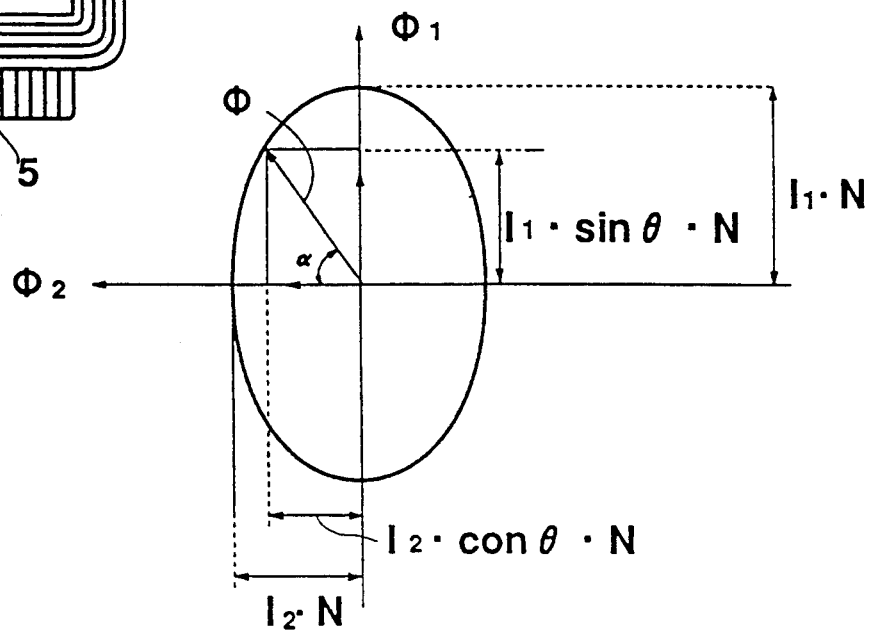
FIG. 5 is a phase diagram showing the characteristics of a magnetic field component produced by the cross coil of FIG. 4.

In the case where the cross coil of the present invention as described above is utilized in a cross coil type indicator, it is possible to make the currents $I_o$ equal and the magnitudes of the magnetic fields $\phi_1$ and $\phi_2$ equal as in Equations (1) and (2) so that the magnetic field component $\phi$ has circular characteristics corresponding to the angle $\theta$, as shown in FIG. 3. Accordingly, if the angle $\theta$ is changed in accordance with a specified measured value, the direction of the magnetic field component $\phi$ accurately corresponds to the specified measure value. It is therefore possible to accurately indicate the specified measured value based on the angle $\theta$, using a magnetic rotor M and an indicating pointer A.

Figure 8:
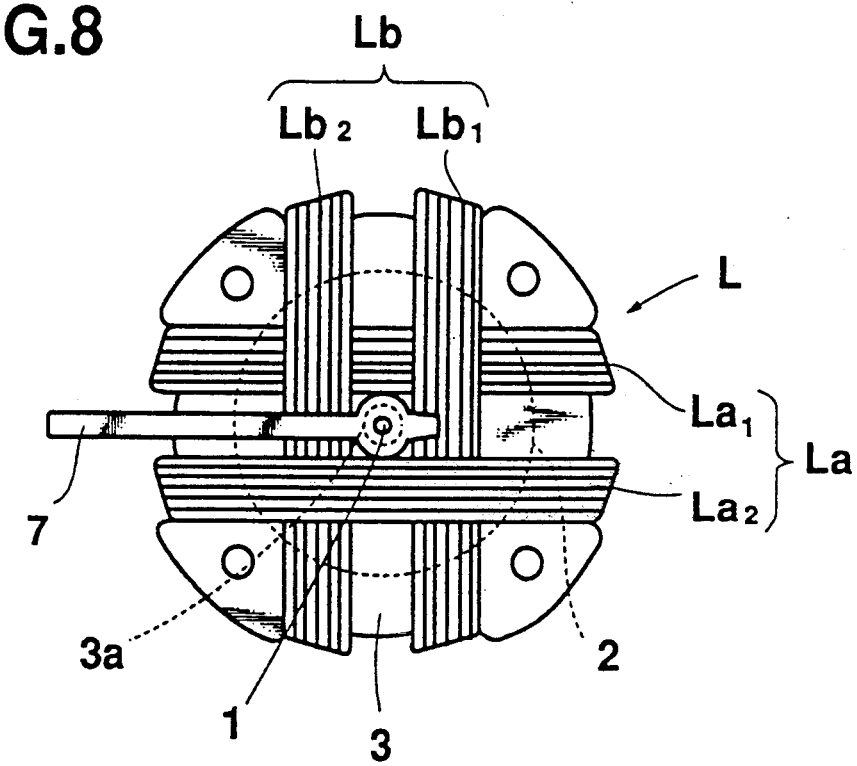
FIG. 8 is a plan view of a cross coil of a second embodiment of the present invention.

FIG. 8 shows a second embodiment of the present invention. The first coil $L_a$ and the second coil $L_b$ of the cross coil L which comprises a plurality of turns of a wire, respectively, are each divided into two parts, resulting in the coils $L_{a1}$, $L_{a2}$, $L_{b1}$, $L_{b2}$ (hereinafter referred to as half-wound sections), each of which has the same number of windings. The first coil $L_a$ and the second coil $L_b$ are wound at 90° to each other, and each of the coils $L_a$, $L_b$ is wound so that the bearings $3a$ provided on the coil bobbin 3 is located between the half-wound sections $L_{a1}$ and $L_{a2}$ of the first coil $L_a$, and between the half wound sections $L_{b1}$, $L_{b2}$.

As can also be understood from FIG. 8, when winding the cross coil L, first one side of the half-wound section $L_{a1}$ of the first coil $L_a$ is wound onto the coil bobbin 3, the winding direction is shifted 90°, then one side of the half-wound section $L_{b1}$ of the second coil $L_b$ is wound thereon, by shifting the winding direction at 90° with respect to the half-wound section $L_{a1}$ of the first coil $L_a$. In this condition, the half-wound section $L_{b2}$, which is connected to the half-wound section $L_{b1}$, is also wound on the opposite side of the bearing $3a$ in the same manner as the half-wound section $L_{b1}$ of the second coil $L_b$. Then, when the winding of the half-wound sections $L_{b1}$ and $L_{b2}$ of the second coil $L_b$ is completed, the winding direction is again shifted 90°, and the remaining half-wound section $L_{a1}$ of the first coil $L_a$ is wound opposite the half-wound section $L_{a1}$ such that the bearing $3a$ is inserted between the half-wound sections $L_{a1}$ and $L_{a2}$.

By means of the cross coil L wound in this manner, the half-wound sections $L_{b1}$ and $L_{b2}$ of the second coil $L_b$ are arranged at the same distance respectively from the magnetic rotor 2. On the other hand in the first coil $L_a$, the half-wound section $L_{a1}$ is closer to the magnetic rotor 2 than the second coil $L_b$, and the half-wound section $L_{a2}$ is further away from the second coil $L_b$.

Accordingly, the magnetic field component of the half-wound sections $L_{a1}$ and $L_{a2}$, specifically, the magnetic field of the first coil $L_a$, and the magnetic field component of the half-wound sections $L_{a1}$, $L_{a2}$, specifically, the magnetic field of the second coil $L_b$, become substantially equal. The change in the azimuth angle (indicated value) of the magnetic field components of the first coil $L_a$ and the second coil $L_b$, with respect to the phase angle $\theta$ of the input current explained in FIG. 3, becomes linear, so that it becomes possible to accurately indicate the measured value.

In addition, in the cross coil L as previously described, the second coil $L_b$ (half wound sections $L_{b1}$ and $L_{b2}$) is wound on the outside of the windings of the half wound section $L_{a1}$ of the first coil $L_a$, and the remaining half wound section $L_{a2}$ of the first coil $L_a$ is wound on the outside of the second coil $L_b$. Therefore it is only necessary to change direction twice during the winding process, thus leading to the simplification of the winding process. Namely, this is a very simple method compared with the conventional winding process in which each layer is wound alternately since it is sufficient to change the winding direction twice in the winding process.

In the foregoing embodiment of the present invention, the number of windings on the half-wound sections $L_{a1}$, $L_{a2}$, $L_{b1}$ and $L_{b2}$ of which the cross coil L is constructed is the same. However, because the number of windings on a cross coil is generally large, even when there is a slight difference in the number of windings on each half-wound section, it is possible to obtain the same effect as described above, if the first coil is almost divided into two half-wound sections, and if the winding is alternately performed in the order of one of the half-wound sections of the first coil, the second coil and the remaining half of the first coil.

In a cross coil type indicator incorporating the cross coil of the present invention as explained above, the first and second coils, wound such that the windings cross each other and enclose the magnetic rotor, are respectively divided into two halves and wound on both sides of the indicating pointer shaft. The two half-wound sections of the second coil is wound on the outside of the windings of half of the first coil, and the remaining half of the first coil is wound on the outside of the second coil. For this reason, the winding of the cross coil can be completed by changing the direction of winding twice only. In addition, because the construction is such that one-half of the first coil, the second coil, and the remaining half of the first coil are wound on the circumference of the magnetic rotor from the inside, in sequence, the effects on the magnetic field component resulting from the difference in distance from the magnetic rotor are cancelled out.

Accordingly, this winding process also makes it possible to easily obtain a cross coil type instrument with accurate indication characteristics.

Figure 9:
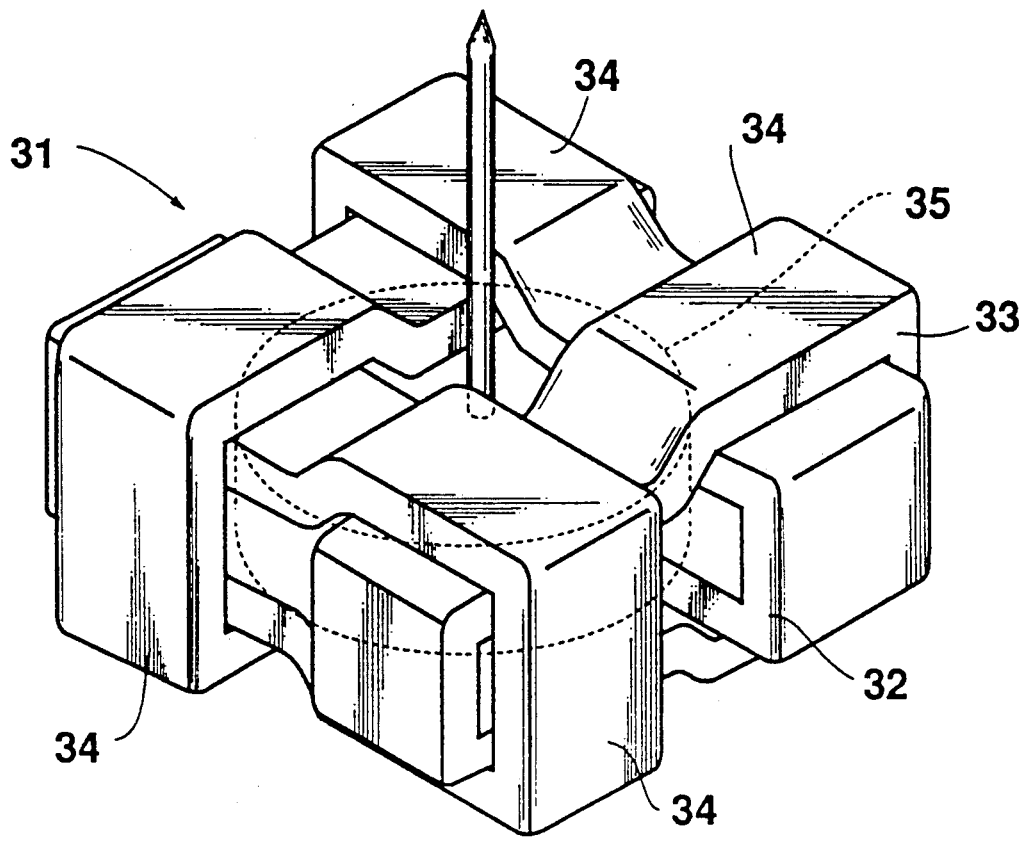
FIG. 9 is a perspective view of a cross coil of a third embodiment of the present invention.

FIG. 9 shows a third embodiment of the present invention. As shown in the drawing, a cross coil 31 according to the present invention comprises four coil bodies 34 to be assembled into a surround such as a grid-like shape. Each of the coil bodies 34 which comprise a plurality of turns of a wire is provided with a narrow section 32 and a wide section 33 into which a narrow section 22 of the adjacent coil body 34 is incorporated. Specifically, the configuration of the cross coil of this embodiment is such that the narrow sections 32 of four coil bodies 34 are fitted into the inside walls of the wide sections 33 of the respective adjacent coil body 34, respectively.

In this case, each of the coil bodies 34 is fabricated in the desired shape after being wound with wires so as to have a hollow space therein by using a press forming method or the like. This coil body may be molded by a resin material.

As shown in FIG. 9, in thus assembled coil bodies 34, a magnetic rotor 35 is provided.

Figure 10:
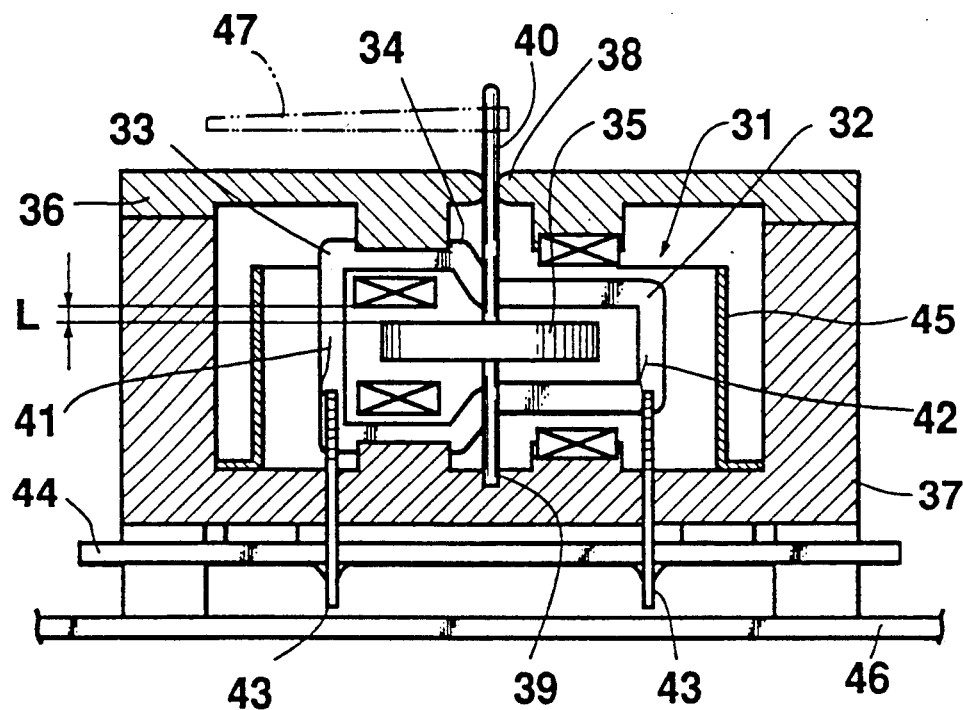
FIG. 10 is a sectional view of an indicator in which the cross coil of the third embodiment of the present invention is installed.
Figure 11:
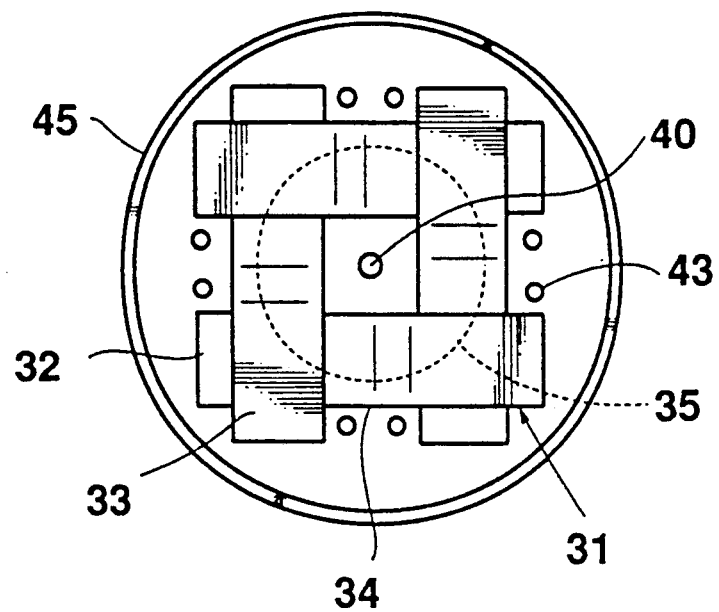
FIG. 11 is a plan view of the main part of the instrument of FIG. 10.

FIG. 10 is a sectional view showing a movement for an indicator using the cross coil 31 of the third embodiment. FIG. 11 is a plan view of the main part of the indicator of FIG. 11. In the cross coil 31, the outer wall of the wide section 33 of the coil body 34 is interposedly supported between an upper frame 36 and a lower frame 37 made of plastic. A rotating shaft 40 of a magnetic rotor 35 is supported in a freely rotatable manner by a pair of bearings 38, 39 with respect to the frames 36, 37. The magnetic rotor 35 is provided in a freely rotatable manner on the inside of the cross coil 31 thus assembled.

A starting end 41 and a terminating end 42 of the single wire which forms each coil 34 are connected to one end of a pin-shaped terminal 43 which is embedded in the lower frame 37 and the other end of the pin shaped terminal 43 which is soldered to a printed circuit of a control wiring board 44, respectively.

A tubular magnetic shield plate 45 and a lower plate 46 for an indicator casing of the indicator are provided.

Here, when a current proportional to a vehicle speed is supplied into the coil body 34 from the control wiring board 44 via the terminal 43, a magnetic field component is produced at the cross coil 31 so that the magnetic rotor 35 rotates in that direction. As a result, the speed is displayed by an indicating pointer 47 provided on the rotary shaft 40.

In this state, the magnitudes and shapes of the coil bodies 34 are the same, respectively. Also, the space L between the narrow section 32 of the coil body 34 and the magnetic rotor 35 is the same for all the coil bodies 34. Therefore, there is good balance between the resistance and the magnetic field of the coil, so the accuracy of measurement is improved several stages in comparison with a conventional cross coil in the same manner as the embodiments as described above.

Further, according to this embodiment, each coil body 34 is formed as one part comprising windings, it is not necessary to wind a coil winding at the manufacturing process thereof. Therefore, the manufacturing process of a cross coil becomes remarkably easy.

It must be understood that the invention is in no way limited to the above embodiments and that many changes may be brought therein without departing from the scope of the invention as defined by the appended claims.

What is claimed is:

1. A cross coil type indicator, comprising:
   a) a coil bobbin;
   b) a magnetic rotor rotatably provided within the coil bobbin, to which a pointer axis is cooperatively connected; and
   c) a cross coil arranged around the coil bobbin in such a manner that the rotor is rotated by the magnetic field component generated in the cross coil, wherein the cross coil comprises:
      i) a first coil winding for generating a first magnetic field when an electrical current flows therethrough, the first coil winding comprising a plurality of at least three turns of a wire wound around the coil bobbin;
      ii) a second coil winding for generating a second magnetic field when an electrical current flows therethrough, the second coil winding comprising a plurality of at least three turns of a wire whose turn number is the same as that of the turns of the first coil winding, and the second coil winding being wound around the coil bobbin so as to cross the first coil winding such that the first and second coil windings are wound relative to each other substantially in a X-shaped manner, whereby the magnetic rotor is rotated by the magnetic field component of the first and second magnetic fields; and
      iii) means for equalizing the magnitude of each of the first and second magnetic fields exerted on the magnetic rotor when the identical voltage is applied to each of the coil windings, said equalizing means comprising the arrangement of the turns of the first and second windings in which the respective turn of the plural turns of one coil winding is alternately wound on the respective turn of the plural turns of the other coil winding with each other such that the wire length of each winding becomes equal and the wire of each winding has the same resistance value, and wherein the length and placement of each of the first and second coil windings about the magnetic rotor is substantially equal so as to equalize the magnitudes of the first and second magnetic fields which are exerted on the magnetic rotor, said means for equalizing comprising the arrangement of coil wires wherein the first turn of the second coil passes over the first turn of the first coil and each subsequent turn of the second coil passes over all previous passed over turns plus one of the first coil and under all subsequent turns of the first coil, and the number of previous turns is incremented by one and the number of subsequent turns is reduced by one for each additional turn of each coil.

* * * * *